(12) United States Patent
Ren et al.

(10) Patent No.: US 6,846,726 B2
(45) Date of Patent: Jan. 25, 2005

(54) SILICON PARTS HAVING REDUCED METALLIC IMPURITY CONCENTRATION FOR PLASMA REACTION CHAMBERS

(75) Inventors: Daxing Ren, Pleasanton, CA (US); Jerome S. Hubacek, Fremont, CA (US); Nicholas E. Webb, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/247,722

(22) Filed: Sep. 20, 2002

(65) Prior Publication Data

US 2004/0161943 A1 Aug. 19, 2004

Related U.S. Application Data

(60) Provisional application No. 60/373,489, filed on Apr. 17, 2002.

(51) Int. Cl.[7] .................. H01L 21/46; H01L 21/78; H01L 21/301
(52) U.S. Cl. .................. 438/460; 438/745; 438/753
(58) Field of Search ................. 438/460, 745, 438/753; 156/345; 118/723 E

(56) References Cited

U.S. PATENT DOCUMENTS

| | | | |
|---|---|---|---|
| 5,074,456 A | 12/1991 | Degner et al. | |
| 5,327,007 A | 7/1994 | Imura et al. | |
| 5,712,198 A | 1/1998 | Shive et al. | |
| 5,882,990 A | 3/1999 | DeBusk et al. | |
| 5,932,022 A | 8/1999 | Linn et al. | |
| 5,993,597 A | 11/1999 | Saito et al. | |
| 6,065,462 A | * 5/2000 | Hodsden et al. | 125/21 |
| 6,230,720 B1 | 5/2001 | Yalamanchili et al. | |
| 6,255,017 B1 | 7/2001 | Turner | |
| 6,376,385 B2 | 4/2002 | Lilleland et al. | |
| 6,376,977 B1 | 4/2002 | Kawai et al. | |
| 6,391,787 B1 | 5/2002 | Dhindsa et al. | |
| 6,506,254 B1 | 1/2003 | Bosch et al. | |
| 2001/0023082 A1 | 9/2001 | Vepa et al. | |

FOREIGN PATENT DOCUMENTS

| | | |
|---|---|---|
| JP | 2000021852 | 1/2000 |
| JP | 2000228380 | 8/2000 |
| JP | 2000349073 | 12/2000 |
| WO | WO 01/75189 A2 | 10/2001 |
| WO | WO 02/03427 A2 | 1/2002 |

OTHER PUBLICATIONS

Werner Kern et al., Chp V–1, Chemical Etching, Thin Film Processes, Academic Press, Inc., pps. 401–445, London 1978.

Richard Lane, Silicon Wafer Preparation, Handbook of Semiconductor Silicon Technology, 1990, pps. 192–239, Noy s Publication, USA.

R. Holzl et al., Gettering Efficiencies for Cu and Ni as a function of size and density of Oxygen Precipitates in p/p–Silicon Epitaxial Wafers, Applied Physics A Materials Science & Processing, pps. 137–142, A 78, Jun. 20, 2001.

T. Ikeda et al., Surface Structures and Growth Mode for the Cu/Si(110) Surfaces Depending on Heat Treatment, Surface Science 342 (1995) pps. 11–20.

(List continued on next page.)

Primary Examiner—Alexander Ghyka
(74) Attorney, Agent, or Firm—Burns, Doane, Swecker & Mathis, L.L.P.

(57) ABSTRACT

Silicon parts of a semiconductor processing apparatus containing low levels of metal impurities that are highly mobile in silicon are provided. The silicon parts include, for example, rings, electrodes and electrode assemblies. The silicon parts can reduce metal contamination of wafers processed in plasma atmospheres.

26 Claims, 2 Drawing Sheets

OTHER PUBLICATIONS

Mohammad Shabani et al., Competitive Gettering of Fe, Ni and Cu In Silicon Wafers by Polysilicon Backside and Int mal Gettering, Electrochemical Society Proceedings V. 97–22, pps. 317–327, New Jersey, USA.

Mohammad Shabani et al., Simox Side or Polysilicon Backside Which is the Stronger Gettering Side for the Metal Impurities, Seventh International Symposium on Silicon–On–Insulator Technology and Devices, 1996, vol. 96–3, pps.. 161–173, New Jersey, USA.

Ryoya Ishigami et al., Thermal Behavior of Cu Films on the Si(111) Surface in the Monolayer Regime, Surface Science, May 1994, pps. 302–308, vol. 315 (1994) Elsevier Science B.V.

W.R. Runyan et al., Semiconductor Integrated Circuit Processing Technology, pps. 249–251 and 414–415, Addison Wesley, 1994.

C.R.M. Grovenor, Microelectronic Materials, Institute of Physics Publishing, 1994, pps. 28–32 and 452–453.

Notification of Transmittal of the International Search Report or the Declaration for PCT/US03/08702 dated Jul. 25, 2003.

Notification of Transmittal of the International Preliminary Examination Report dated Mar. 1, 2004 for PCT/US03/08702.

Written Opinion dated Dec. 5, 2003.

* cited by examiner

SILICON PARTS HAVING REDUCED METALLIC IMPURITY CONCENTRATION FOR PLASMA REACTION CHAMBERS This application claims the benefit of Provisional application Ser. No. 60/373,489, filed Apr. 17, 2002.

BACKGROUND OF THE INVENTION

1. Field of the Invention

The invention relates to silicon parts for plasma reaction chambers for processing semiconductor materials. The invention also relates to processes of making and using the silicon parts.

2. Description of the Related Art

In the field of semiconductor material processing, vacuum processing chambers are used for the etching of materials and for chemical vapor deposition (CVD) of materials onto substrates. A process gas is flowed into the processing chamber while energy, such as a radio frequency (RF) field, is applied to the process gas to generate a plasma.

An upper electrode (or "showerhead electrode") 10 in an assembly for a single wafer etcher as disclosed in commonly-assigned U.S. Pat. No. 6,376,385 is shown in FIG. 1. The upper electrode 10 is typically used with an electrostatic chuck including a bottom electrode (not shown) on which a wafer is supported below the upper electrode 10.

The electrode assembly is a consumable part, which must be replaced periodically. Because the electrode assembly is attached to a temperature-controlled member, for ease of replacement, the upper surface of the outer edge of the upper electrode 10 has been bonded to a support ring 12. An outer flange on the support ring 12 is clamped by clamping ring 16 to a temperature-controlled member 14 having water cooling channels 13. Water is circulated in the cooling channels 13 via water inlet/outlet connections 13a, 13b. A plasma confinement ring 17 surrounds the upper electrode 10. The plasma confinement ring 17 is attached to a dielectric annular ring 18, which is attached to a dielectric housing 18a. The plasma confinement ring 17 causes a pressure differential in the reactor and increases electrical resistance between the reaction chamber walls and the plasma, thereby concentrating the plasma between the upper electrode 10 and the lower electrode.

Process gas from a gas source is supplied to the upper electrode 10 through an opening 20 in the temperature-controlled member 14. The process gas is distributed through one or more baffle plates 22 and passes through gas flow passages (not shown) in the upper electrode 10 to disperse the process gas into the reaction chamber 24. To enhance heat conduction from the upper electrode 10 to the temperature-controlled member 14, process gas can be supplied to fill open spaces between opposed surfaces of the temperature-controlled member 14 and the support ring 12. In addition, a gas passage 27 connected to a gas passage (not shown) in the annular ring 18 or confinement ring 17 allows pressure to be monitored in the reaction chamber 24. To maintain process gas under pressure between the temperature-controlled member 14 and the support ring 12, a seal 28 is provided between a surface of the support ring 12 and an opposed surface of the member 14, and a seal 29 is provided between an upper surface of support ring 12 and an opposed surface of the member 14. In order to maintain the vacuum environment in the reaction chamber 24, additional seals 30, 32 are provided between the member 14 and a member 18b, and between the member 18b and the housing 18a.

In such a parallel plate plasma reactor, a wafer to be processed is placed on the lower electrode, and a RF plasma is generated between the lower electrode and the upper electrode, which is parallel to the lower electrode. The upper electrode has been made of graphite. However, as described in U.S. Pat. No. 6,376,977, during plasma etching, particles of graphite upper electrodes can drop onto and contaminate wafers that are being processed in the reaction chamber.

The upper electrode of parallel plate plasma reactors has also been made of single crystal silicon material. However, as described in U.S. Pat. No. 6,376,977, heavy metal impurities can adhere to the single crystal silicon during manufacture of the upper electrode. The metal impurities can cause contamination problems when the upper electrode manufactured from the single crystal silicon material is subsequently used in semiconductor device processing.

U.S. Pat. No. 5,993,597 discloses that plasma etching electrodes made of silicon generate dust due to stress and microcracks on the electrode surface during plasma etching.

In view of the high purity requirements for processing semiconductor materials, there is a need for parts, such as electrodes, of semiconductor processing apparatus that have reduced levels of metal impurities, and which can reduce contamination of semiconductor materials by such metal impurities during processing.

SUMMARY OF THE INVENTION

Silicon parts for use in semiconductor processing apparatus are provided. The silicon parts have reduced levels of metal impurities that have high mobility in silicon. The silicon parts can be used in plasma processing chambers to reduce, and preferably minimize, contamination of semiconductor substrates by such metal impurities during semiconductor processing.

A preferred embodiment of a method of making a silicon part comprises cutting a silicon plate from a silicon material. During cutting, metal impurities adhere to the cut surface of the silicon plate. At least the cut surface of the silicon plate is treated to remove metal impurities from the silicon plate.

The metal impurities can comprise metals that are highly mobile in silicon. The metal impurities can originate primarily from a cutting tool used to cut the silicon plate from the silicon material. The silicon plate preferably is treated before the metal impurities have had sufficient time to migrate from the cut surface of the silicon plate to outside of the cut surface region. The treating removes metal impurities contained in the cut surface region. In preferred embodiments, the concentration of metal impurities on the cut surface of the silicon plate can be reduced to low levels.

In a preferred embodiment, the silicon part is a silicon electrode or a silicon electrode assembly. In another preferred embodiment, the silicon electrode is used in a showerhead of a semiconductor processing apparatus.

BRIEF DESCRIPTION OF THE DRAWINGS

Preferred embodiments of the invention will be readily understood by the following detailed description in conjunction with the accompanying drawings, in which.

DETAILED DESCRIPTION OF THE PREFERRED EMBODIMENTS

Figure 1:
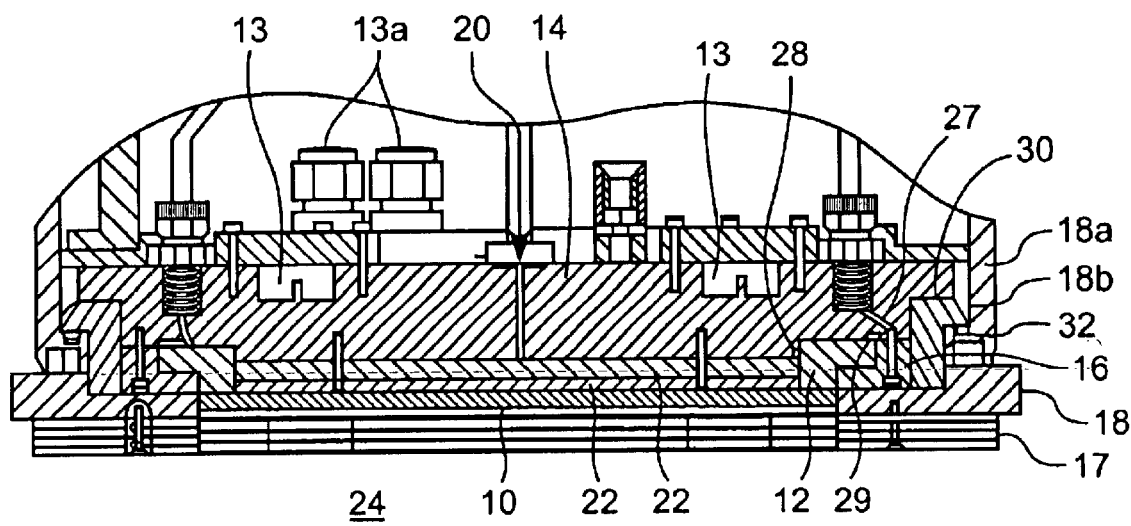
FIG. 1 is a cross-sectional view illustrating an embodiment of showerhead electrode assembly.

Silicon parts suitable for use in semiconductor processing apparatuses are provided. The silicon parts contain low levels of metals that are unintentional impurities in silicon. Such metal impurities are undesirable because they can affect the performance of the silicon parts, as well as contaminate semiconductor substrates during semiconductor material processing.

In a preferred embodiment, the silicon part is a silicon electrode. In another preferred embodiment, the silicon part is provided in a silicon electrode assembly. Other exemplary silicon parts that can be made include rings used in a plasma reaction chamber. As described below, such silicon parts can be made by slicing a silicon ingot and treating the sliced part to provide a significantly reduced metal impurity level in the part.

The silicon parts are manufactured by cutting silicon plates from a silicon material using a cutting tool. The cutting tool includes an outer metal surface that contacts the silicon material during cutting. For example, the cutting tool can be a wire saw, which includes a metallic blade having a metal coating. During cutting, metal contained in the metal coating can be removed from the blade by wear and adhere to one or more surfaces of the silicon plate.

Copper and copper alloys are exemplary materials that have been used to form metal outer coatings of blades of wire saws used to cut silicon materials. Brass, which contains copper and zinc, has been used as a coating in wire saw blades. For example, brass outer coatings have been applied over iron-containing materials, such as steels, in wire saw blades. As described in the publication by M. B. Shabani et al. entitled "SIMOX Side or Polysilicon Backside which is the Stronger Gettering Side for the Metal Impurities," Proceedings of the Seventh International Symposium on Silicon-On-Insulator Technology and Devices, The Electrochemical Society, Inc., Vol. 96–3, pages 162–175 (1996), copper has a high mobility in silicon by diffusion. Copper has a low activation enthalpy for diffusion in silicon and thus is mobile in the silicon crystal even at low temperatures. Consequently, copper can diffuse rapidly in the bulk of silicon, crystal at high and low temperatures. In addition, copper can out-diffuse to silicon surfaces and aggregate on the surfaces during cooling down of silicon from elevated temperatures. Such aggregation can also occur at room temperature. Copper contamination is a problem in the manufacture of high purity, p-type and n-type silicon wafers.

In addition to copper, other metals that have high mobility in silicon include, e.g., zinc, titanium, vanadium, chromium, manganese, iron, cobalt and nickel. Alkali metals, such as sodium, also have high mobility. See, W. R. Runyan and K. E. Bean, *Semiconductor Integrated Circuit Processing Technology*, Addison Wesley, pages 414–415 (1994). These metals can create deep electronic states in silicon and consequently degrade the performance of silicon devices. See, C. R. M. Grovenor, *Microelectronic Materials*, Institute of Physics Publishing, pp. 28–32 (1994).

The inventors have discovered that the cutting process used to cut silicon plates from silicon material can result in metal impurities adhering to one or more surfaces of the silicon plates. These metals have been discovered to originate from wear of the cutting tool. Metal impurities contained in the cutting tool can include copper and iron, as well as other metals having a high mobility in silicon. Coolants and slurries used in the cutting process can also introduce metal impurities. Due to their high mobility, these metals can diffuse rapidly into the silicon bulk at low and elevated temperatures. The inventors discovered that unless these metals are removed from a surface region of a silicon plate within a sufficiently short period of time after the cutting process has been completed, the metals can diffuse from the surface region into the interior of the silicon material. The metals can subsequently migrate from the silicon bulk and aggregate at the silicon plate surface. Consequently, when the silicon electrode plate is manufactured into an electrode assembly and used in a plasma reactor during semiconductor material processing, metal impurities in exposed surface regions of the electrode can be removed from the silicon electrode plate by the plasma environment. The removed metal impurities can contaminate wafers processed in the plasma chamber.

The inventors further discovered that once copper and/or other similarly mobile metals have migrated outside of the surface region of a silicon electrode plate, even if the surface of the silicon electrode plate is later treated to remove metal impurities that have aggregated at the silicon surface, such treatment is incapable of satisfactorily removing the metal impurities present in the silicon bulk outside of the surface region. Consequently, metal impurities present in the silicon bulk can continue to migrate from the silicon bulk to the silicon surface and aggregate there, thus providing a continuing source of metal impurities that can contaminate semiconductor substrates during plasma processing.

Silicon wafer preparation processes are described by Richard L. Lane, Chapter 4, "Silicon Wafer Preparation", in William C. O'Mara et al. eds., *Handbook of Semiconductor Silicon Technology*, Noyes, 1990. These processes cut wafers by slicing silicon crystals into wafers, followed by heat treating the wafers to normalize resistivity. These processes include a wafer etching step performed after heat treating the wafer. The etching step uses chemical etchants to remove damaged surface layers of the wafer. However, the etching step is not effective to remove metal impurities resulting on the wafer surface from slicing. Consequently, metal impurities remaining in the wafer after etching can provide a source of contamination.

The inventors discovered that known cleaning techniques for cleaning sliced silicon electrode plates after the cutting operation has been performed, that utilize a bath and surfactant solutions, are unable to satisfactorily remove adhered metal impurities, such as copper and similarly mobile metals, from the surface regions of the silicon electrode plates. In fact, metal removal is unsatisfactory even if such cleaning techniques are performed shortly after the silicon electrode plates have been sliced from the silicon material, because the adhered metals are not adequately removed from silicon electrode plate surfaces by such cleaning techniques. Consequently, copper and other highly mobile metal impurities that remain on or near the surface of the silicon plate after the cleaning can diffuse into the silicon electrode plate bulk. Such diffusion is enhanced when the surface-contaminated silicon electrode plate is heated to an elevated temperature, such as during annealing or during bonding of the silicon plate to support members to form an electrode assembly. The metal impurities can migrate from the bulk to the surface region of the silicon electrode plate during cooling of the silicon electrode plate from the elevated temperature. As a result, the quality of an electrode produced from the silicon electrode plate is inconsistent due to the presence of the metal impurities in the silicon electrode plate.

In addition, the residual metal impurities can be removed from the electrode during plasma processing of wafers and consequently contaminate the wafers, as described above. Consequently, silicon devices manufactured from the contaminated wafers can have unsatisfactory performance. For example, it has been reported that in silicon solar cells, copper, chromium, iron, titanium and vanadium are "lifetime killer" impurities and, have maximum tolerable concentration levels ranging from about $10^{13}$ to $10^{15}$ atoms/$cm^3$, for a 10% device efficiency, and should be excluded from silicon material in concentrations higher than about 10 parts per billion (ppb). See C. R. M. Grovenor, *Microelectronic Materials*, pages 452–453. Accordingly, it is desirable for silicon electrode plates to contain low concentrations of these metals so that the metals are not introduced into silicon substrates used to form such silicon devices.

The inventors discovered that copper and other metals that diffuse rapidly in silicon are not satisfactorily removed from silicon electrode plates by conditioning the reaction chamber by placing dummy semiconductor wafers in the reaction chamber and operating the plasma reactor. The reason for this is that the metal impurities are located in the silicon bulk of the electrode and continue to diffuse to the exposed surface of the electrode during use of the electrode in processing substrates.

In view of the above-described discoveries, processes of making silicon electrodes having low levels of metal impurities characterized by a high mobility in silicon, and that are undesirable impurities in silicon electrodes and in silicon substrates, such as semiconductor wafers, are provided. The silicon electrodes can be used to provide reduced metal impurity levels in semiconductor processing apparatuses, such as plasma etch chambers and plasma deposition chambers.

Figure 2:
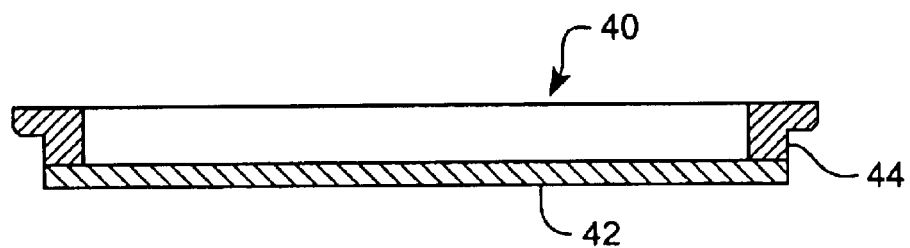
FIG. 2 is a cross-sectional view illustrating an embodiment of an electrode assembly including a planar silicon electrode.

FIG. 2 illustrates an exemplary embodiment of a silicon electrode assembly 40. The silicon electrode assembly 40 includes an electrically conductive, silicon electrode (or silicon plate) 42, which is bonded to a support ring 44, such as a graphite or silicon carbide support ring. The silicon electrode 42 is preferably planar, but it can have a non-uniform thickness. For example, in some embodiments the silicon electrode 42 thickness can be about ¼ inch. If desired, the electrode can be thicker. A thick electrode can be about 0.3 to 1 inch thick. The silicon electrode assembly 40 is preferably a showerhead electrode provided with a plurality of spaced apart gas discharge passages. The passages have a size and hole pattern suitable for supplying a process gas into a process chamber at a desired flow rate and distribution. The electrode can be a powered electrode or grounded electrode. The process gas can be energized by the silicon electrode assembly 40 so as to form a plasma in the reaction chamber beneath the silicon electrode assembly.

The silicon electrode 42 and the support ring 44 can be bonded together by any suitable bonding material. Preferably, the silicon electrode 42 and the support ring 44 are bonded together using an elastomeric material. The bonding process preferably is a process as described in commonly assigned U.S. Pat. No. 6,376,385. For example, the elastomeric joint can comprise a suitable polymer material compatible with a vacuum environment and resistant to thermal degradation at elevated high temperatures that occur during plasma processing.

The mating surfaces of the silicon electrode 42 and the support member 44 can be planar or non-planar surfaces. Alternatively, the mating surfaces can be contoured to provide an interlocking and/or self-aligning arrangement.

To achieve a good quality elastomeric joint, it is desirable to densify the elastomer bonding material prior to applying the bonding material to the mating surfaces. For example, the elastomeric bonding material can be subjected to vibration in a vacuum environment at ambient or elevated temperatures.

The elastomeric bonding material can be applied to at least one of the mating surfaces of the silicon electrode 42 and support member 44. After the bonding material has been applied, the bonding material can be densified. The silicon electrode 42 and support member 44 can be assembled by pressing the mating surfaces together and pressure can be applied at the joint during bonding.

The elastomeric bond can be cured at any suitable temperature and in any suitable environment. For example, the electrode assembly 40 can be placed in an oven and heated to a temperature effective to accelerate curing of the bond without inducing excessive thermal stress into the silicon electrode or support member. For an electrode and support member described above, it is desirable to maintain the temperature below 60° C., e.g., 45 to 50° C. for a suitable time, e.g., 3 to 5 hours. After the bond is cured to form the elastomeric joint, the electrode assembly is cooled.

Figure 3:
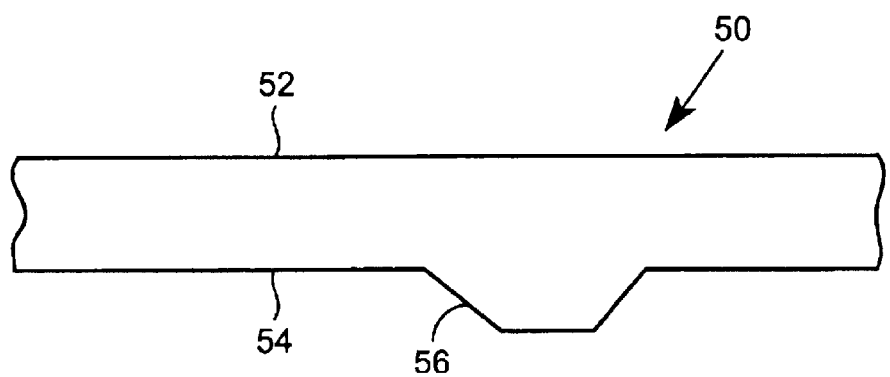
FIG. 3 illustrates an embodiment of a stepped silicon electrode.

FIG. 3 illustrates another exemplary embodiment of a silicon electrode (or electrode plate) 50. As described in commonly assigned U.S. Pat. No. 6,391,787, which is incorporated herein by reference in its entirety, the silicon electrode 50 includes an upper surface 52 and a lower surface 54 including a step 56. The step 56 is provided to control the density of plasma formed adjacent to the exposed lower surface 54 during plasma processing. The silicon electrode 50 can have a thickness, e.g., of about 0.25 inch or 0.33 inch or greater.

Figure 4:
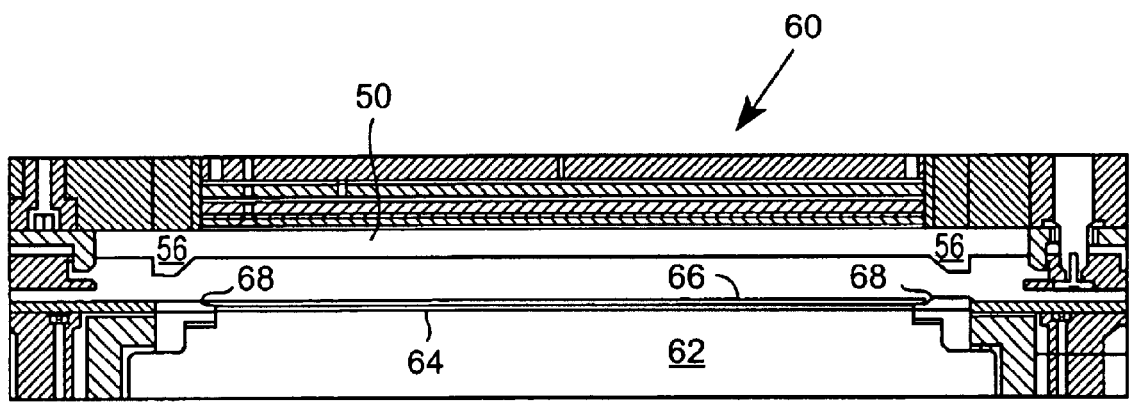
FIG. 4 is a cross-sectional view illustrating a parallel plate plasma apparatus including a stepped electrode as shown in FIG. 3.

FIG. 4 illustrates the silicon electrode 50 mounted in a parallel plate plasma processing apparatus 60. The plasma processing apparatus 60 includes a substrate support 62, an electrostatic chuck 64 disposed on the substrate support 62, a substrate 66, such as a semiconductor wafer, supported on the electrostatic chuck, and an edge ring 68.

An exemplary method of making silicon electrodes and silicon electrode assemblies will now be described. A silicon plate is cut from a silicon material. The silicon material is preferably a single crystal silicon material, which has the ability to wear uniformly to increase lifetime, and also can operate with minimal or particle-free performance. The silicon material can be doped or undoped material. For example, the silicon material can be doped with boron, phosphorous or any other suitable dopant to provide desirable electrical properties. The crystal orientation of the silicon plate is not limited, and the silicon electrode can have (100), (111) or (110) faces.

The silicon electrode is preferably produced by cutting a single crystal silicon ingot by abrasive cutting to form a single crystal silicon plate. The slicing process typically utilizes a cutting blade. For example, the cutting blade can comprise steel having a brass coating over the steel. During slicing of the ingot, the coating can be removed from the blade due to wear. Coolants, lubricants and slurries typically used during cutting can also contribute to metal removal from the blade, as well as introduce impurities. The removed metal can adhere to one or more surfaces of the silicon plate, and particularly to the cut surface, which directly contacts the blade during cutting.

As described above, the presence of metal impurities, such as copper, on any surface of the silicon plate is undesirable because such metals are a contamination source and degrade the quality of the silicon plate. In addition, when the silicon plate is incorporated into a silicon electrode assembly and used in a plasma reactor during semiconductor processing, the metal impurities provide a contamination source for semiconductor substrates processed in the plasma reactor. Accordingly, it is desirable to reduce the level of metal impurities on the surface of the silicon plate after cutting to a desirably low level in order to overcome these problems.

The problems of metal contamination can be addressed by treating the silicon plate to remove metal impurities on one or more surfaces of the silicon plates before the metals have had sufficient time to diffuse too deeply into the silicon bulk. The metal impurities are preferably removed from the silicon plate while they are located substantially within a surface region of the silicon plate after the slicing operation has been completed. By treating the silicon plates to remove a portion that includes at least the surface region, and thus to remove metal impurities contained in the surface region, the problem of the metal impurities later migrating to the silicon plate surface during semiconductor processing, and providing a source of contamination to semiconductor wafers being processed, is reduced.

Accordingly, because solid state diffusion is a time dependent process, it is desirable to perform the treating step soon after the silicon plates have been sliced from a silicon material, such as an ingot. Preferably, the treating is performed before copper and/or other metal impurities having a similar mobility in silicon as copper, have had sufficient time to diffuse outside of a surface region of the silicon plate and to a depth below which removal of the metal impurities becomes problematic. Such other metals besides copper can include one or more of zinc, titanium, vanadium, chromium, manganese, iron, cobalt, nickel and the like, depending on the composition of the cutting tool used to cut the silicon plate, as well as the presence of other, typically minor, impurity sources during the slicing. Other metal impurities can include alkali metals including, for example, calcium, potassium and sodium. Because copper has a very high mobility in silicon, treating the silicon plate to sufficiently remove copper present in the surface region can also effectively remove other metals having a similarly high or lesser mobility in silicon than copper, and that may also be present in the surface region along with copper.

For example, the surface region of as-sliced silicon plates that can be removed during treating can have a thickness up to at least about 25 microns, and preferably up to at least about 100 microns. Surface regions having a different thickness, such as less than 25 microns, or greater than 100 microns, can also be removed by treating. A surface region having such thickness can be removed by treating the silicon electrode plate with a chemical solution. The chemical solution treatment comprises contacting at least the cut surface of the silicon plate with a chemical solution. Preferably, the entire outer surface of the silicon plate is contacted with the chemical solution so that any metal impurities adhered to the wafer surface at locations other than the cut surface can also be removed.

The chemical solution treatment can include dipping the silicon plate into the chemical solution. Alternatively, the chemical solution can be applied to the silicon plate at selected locations of the silicon plate surface by any other suitable process, such as spraying. Chemical mechanical polishing (CMP) may alternatively be used.

The chemical solution can have any suitable chemical composition that is effective to remove at least the surface region of the silicon plate. Etchant compositions, etch rates, and etching procedures for etching silicon are well known in the art as described, for example, in W. Kern and C. A. Deckart, Chapter V-1, "Chemical Etching", in J. L. Vossen and W. Kern eds., *Thin Film Processes*, Acedemic Press, Inc., London, 1978, which is incorporated herein by reference in its entirety. For example, the chemical solution can be an acid solution containing hydrofluoric acid (HF); a mixture of nitric acid ($HNO_3$) and HF; a mixture of $HNO_3$ and HF and optionally acetic acid ($CH_3COOH$) (see U.S. Pat. No. 6,376,977); and mixtures of HF, $HNO_3$, $CH_3COOH$ and $NaClO_2$; HF, $HNO_3$, $CH_3COOH$ and $HClO_4$; HF, $HNO_3$ and $NaNO_2$; HF, $CH_3COOH$ and $KMnO_4$; HF and $NH_4F$; and $H_2O$, HF and NaF.

As described in W. R. Runyan and K. E. Bean, *Semiconductor Integrated Circuit Processing Technology*, pages 249–251, a mixture containing 3 HF, 5 $HNO_3$, 3 $CH_3COOH$ has a room temperature etch rate of silicon of about 25 microns/minute, and a mixture containing 2 HF, 15 $HNO_3$, 5 $CH_3COOH$ has an average room temperature etch rate of silicon of about 3.5–5.5 microns/minute (all parts by volume; 49% HF, 70% $HNO_3$, 100% $CH_3COOH$). Based on these removal rates, the former mixture can be used to remove a surface region thickness of silicon electrode plates of about 25 microns in about 1 minute, and a thickness of about 100 microns in about 4 minutes. The second mixture provides a slower silicon removal rate and thus requires a longer treatment time to remove an equivalent amount of material. The concentration of the acid solution can be adjusted to control the removal rate of silicon and metal impurities so that the treatment can be conducted within a desired treatment time.

Alternatively, the chemical solution can be a basic solution, such a solution comprising one or more of ammonium hydroxide, sodium hydroxide and potassium hydroxide. One or more suitable chelating acids, such as ethylenediaminetetracetic acid (EDTA) and the like, can be added to the chemical solution to enhance metal impurity removal from the silicon plate.

The concentration of the chemical solution, the solution temperature, pH and other parameters can be selected to achieve the desired rate of removal of the surface region. The silicon plate can be contacted with the chemical solution for an amount of time effective to remove a desired portion of the silicon plate.

The treating preferably achieves a desired low concentration of copper and other similar metals described above at the surface of the silicon plate. For example, the treating preferably can reduce the concentration of copper at the surface of the silicon plate to less than about $100 \times 10^{10}$ atoms/cm$^2$, and more preferably less than about $10 \times 10^{10}$ atoms/cm$^2$. The treating preferably can also reduce the concentration of other mobile metals including zinc, titanium, vanadium, chromium, manganese, iron, cobalt and nickel to less than about $100 \times 10^{10}$ atoms/cm$^2$, and more preferably less than about $10 \times 10^{10}$ atoms/cm$^2$.

After the silicon plate has been treated to remove metal impurities present at one or more surfaces, the silicon plate is rinsed to remove any residual chemical solution. Preferably, the silicon plate is rinsed with high-purity, deionized water to remove substantially all chemical solution from the silicon plate.

Following rinsing, the silicon plate can be further processed depending on the application. The as-rinsed silicon plate can optionally be annealed to achieve desired electrical properties. The annealing process can be conducted in an oxygen-containing atmosphere to introduce a desired concentration of oxygen into the silicon plate. Typically, annealing is performed at a temperature greater than about 600° C. Because the silicon plate has been treated prior to annealing, the concentration of metal impurities, such as copper, that may be present in the silicon plate is sufficiently low that the problem of aggregation of substantial amounts of these impurities at the silicon plate surface during cooling of the silicon plate from the annealing temperature is overcome.

The silicon plate can then be fabricated to produce the desired final silicon plate configuration. For example, in a preferred embodiment in which the silicon plate is incorporated in a showerhead electrode assembly, a plurality of gas discharge passages can be formed in the silicon plate by any suitable process, e.g., laser drilling, ultrasonic drilling or the like. In addition, mounting holes can be formed in the silicon plate.

The silicon plate can be processed to a desired surface finish. Such processing is preferably performed after gas discharge passages, mounting holes and/or other features are formed in the silicon plate, so that surface damage produced on the silicon plate surface by cutting and/or forming the holes can be removed by the processing. For example, the silicon plate can be processed by a series of sequential steps including grinding, etching, polishing and cleaning steps to remove surface damage and achieve a desired surface finish. Other process steps can optionally be used to achieve the desired final silicon plate.

After producing the desired final silicon plate, the silicon plate can be incorporated into an electrode assembly, such as the electrode assembly 40 shown in FIG. 2, by the exemplary assembly process described above. The silicon plate can alternatively be shaped to form a stepped electrode plate, such as the electrode plate 50 shown in FIG. 3.

The silicon electrodes can be used in various different plasma atmospheres for etching, deposition, as well as other applications. Typical etch chemistries include, e.g., chlorine-containing gases including, but not limited to, $Cl_2$, HCl and $BCl_3$; bromine-containing gases including, but not limited to, bromine and HBr; oxygen-containing gases including, but not limited to, $O_2$, $H_2O$ and $SO_2$; fluorine-containing gases including, but not limited to, $CF_4$, $CH_2F_2$, $NF_3$, $CH_3F$, $CHF_3$ and $SF_6$; and inert and other gases,including, but not limited to He, Ar and $N_2$. These and other gases may be used in any suitable mixture, depending on the desired plasma. Exemplary plasma reactor etching operating conditions are as follows: bottom electrode temperature of from about 25° C. to about 90° C.; chamber pressure of from about 0 mTorr to about 500 mTorr; etchant gas flow rate of from about 10 sccm to about 1000 sccm; and powered electrode power of from about 0 Watts to about 3000 Watts for 200 mm wafers, and from 0 to about 6000 Watts for 300 mm wafers.

The silicon electrodes can be used in any suitable plasma reactor. For example, the silicon electrodes can be used in a dual-frequency, confined plasma reactor, such as an Exelan™ processing chamber available from Lam Research Corporation of Fremont, Calif. In preferred embodiments, medium and high-density plasma reactors can be used. Those skilled in the art will appreciate that the reaction chambers described above are only exemplary plasma etch reactors in which the silicon electrodes can be used. The silicon electrodes can be used in any etch reactor (e.g., a metal etch reactor) or other type of semiconductor processing apparatus, where the reduction of metal contamination of wafers is desired.

The above-described silicon parts have reduced concentrations of copper, and other mobile metal impurities, that are detrimental to the performance of the silicon parts and to silicon substrates, such as silicon wafers. Consequently, the silicon parts have high quality. In addition, by utilizing the silicon parts in semiconductor processing apparatuses, the contamination of semiconductor substrates processed in the apparatuses, by metal impurities such as copper and other similarly mobile metal impurities, can be reduced.

While the invention has been described in detail with reference to specific embodiments thereof, it will be apparent to those skilled in the art that various changes and modifications can be made, and equivalents employed, without departing from the scope of the appended claims.

What is claimed is:

1. A method of making a silicon part of a semiconductor processing apparatus, comprising:

cutting a silicon plate from a silicon material using a wire saw comprising copper or a copper alloy such that metal impurities including at least copper are removed from the wire saw and adhere to a cut surface of the silicon plate during the cutting;

treating at least the cut surface of the silicon plate with a solution to remove at least some of the copper from the surface region including the cut surface; and annealing the treated silicon plate in an oxygen atmosphere to introduce oxygen into the silicon plate.

2. The method of claim 1, wherein the metal impurities further include at least one element selected from the group consisting of zinc, titanium, vanadium, chromium, manganese, iron, cobalt, nickel and alkali metals, and the concentration of copper or of the at least one element on at least the cut surface of the silicon plate after the treating is less than about $100 \times 10^{10}$ atoms/cm$^2$.

3. The method of claim 1, wherein the concentration of copper on at least the cut surface of the silicon plate after the treating is less than about $10 \times 10^{10}$ atoms/cm$^2$.

4. The method of claim 1, wherein the wire saw comprises an outer coating which consists essentially of copper or the copper alloy, and the copper is removed from the outer coating and adheres to at least the cut surface of the silicon plate during the cutting.

5. The method of claim 1, wherein the treating comprises contacting at least the cut surface of the silicon plate with an acidic solution or a basic solution effective to remove a portion of the silicon plate that contains the adhered metal impurities.

6. The method of claim 5, further comprising rinsing the silicon plate after treating to remove substantially all of the acidic solution or basic solution from the silicon plate.

7. A method of making a silicon part of a semiconductor processing apparatus, comprising:

cutting a silicon plate from a silicon material using a wire saw comprising copper or a copper alloy such that metal impurities including at least copper are removed from the wire saw and adhere to a cut surface of the silicon plate during the cutting;

treating at least the cut surface of the silicon plate with a solution to remove at least some of the copper from the surface region including the cut surface, wherein the surface of the silicon plate is treated with the solution before the metal impurities including at least copper have had sufficient time to diffuse into the interior from the surface region of the silicon plate, the surface region having a thickness up to about 100 microns, and the treating removes metal impurities including at least copper in the surface region; and optionally annealing the treated silicon plate.

8. The method of claim 1, wherein the silicon part is a ring.

9. The method of claim 1, wherein the silicon material is single crystal silicon.

10. A method of making a silicon electrode of a semiconductor processing apparatus, comprising:

cutting a silicon plate from a silicon material using a wire saw comprising copper or a copper alloy such that metal impurities including at least copper adhere to a cut surface of the silicon plate during the cutting;

treating at least the cut surface of the silicon plate with a solution to remove at least some of the copper from the surface region including the cut surface; and annealing the treated silicon plate in an oxygen atmosphere to introduce oxygen into the silicon plate.

11. The method of claim 10, wherein the silicon electrode is a planar showerhead electrode or a stepped showerhead electrode.

12. The method of claim 10, further comprising:

annealing the treated silicon plate;

applying a bonding material to join opposed surfaces of a support member and the treated silicon plate; and curing the bonding material to form a joint between the support member and the treated silicon plate.

13. A silicon electrode made by the method of claim 10.

14. A method of processing a semiconductor wafer in a reaction chamber of a semiconductor processing apparatus, comprising:

placing a silicon electrode made by the method of claim 10 in a chamber of a semiconductor processing apparatus;

introducing a process gas into the chamber;

generating a plasma from the process gas by supplying radio frequency power to the silicon electrode and exciting the process gas into a plasma state; and processing a semiconductor substrate in the chamber with the plasma.

15. The method of claim 14, further comprising processing a plurality of semiconductor substrates in the chamber containing the silicon electrode.

16. The method of claim 14, wherein the metal impurities further include at least one element selected from the group consisting of zinc, titanium, vanadium, chromium, manganese, iron, cobalt, nickel and alkali metals, and the concentration of copper or the at least one element on at least the cut surface of the silicon plate after the treating is less than about $100 \times 10^{10}$ atoms/cm$^2$.

17. The method of claim 14, wherein the concentration of copper on at least the cut surface of the silicon plate after the treating is less than about $10 \times 10^{10}$ atoms/cm$^2$.

18. The method of claim 1, wherein the cutting tool consists essentially of metal.

19. The method of claim 10, wherein the cutting tool consists essentially of metal.

20. A method of making a silicon electrode of a semiconductor processing apparatus, comprising:

cutting a silicon plate from a silicon material using a wire saw comprising copper or a copper alloy such that metal impurities including at least copper adhere to a cut surface of the silicon plate during the cutting;

treating at least the cut surface of the silicon plate with a solution to remove at least some of the copper from the surface region including the cut surface, wherein the silicon plate is treated with the solution before the copper has had sufficient time to diffuse into an interior of the silicon plate from the surface region, the surface region having a thickness up to about 100 microns, and the treating removes the copper in the surface region; and optionally annealing the treated silicon plate.

21. The method of claim 10, wherein the silicon plate has a thickness of from about 0.3 to 1 inch.

22. The method of claim 21, wherein the silicon plate has a thickness of from about 0.4 to 1 inch.

23. A method of making a silicon electrode of a semiconductor processing apparatus, comprising:

cutting a silicon plate from a silicon material using a wire saw comprising an outer coating of copper or a copper alloy such that metal impurities including at least copper are removed from the wire saw and adhere to a cut surface of the silicon plate during the cutting;

treating at least the cut surface of the silicon plate with a solution to remove at least copper from the surface region including the cut surface; and annealing the treated silicon plate in an oxygen atmosphere to introduce oxygen into the silicon plate.

24. The method of claim 23, wherein the concentration of copper on at least the cut surface of the silicon plate after the treating is less than about $10 \times 10^{10}$ atoms/cm$^2$.

25. The method of claim 23, wherein the silicon plate has a thickness of from about 0.3 to 1 inch.

26. The method of claim 25, wherein the silicon plate has a thickness of from about 0.4 to 1 inch.

* * * * *